United States Patent [19]

McClelland et al.

[11] Patent Number: 5,675,531
[45] Date of Patent: Oct. 7, 1997

[54] DEVICE FOR INFORMATION STORAGE USING FIELD EMISSION

[75] Inventors: Gary Miles McClelland, Palo Alto, Calif.; Fumiya Watanabe, Fukuoka, Japan

[73] Assignee: International Business Machines Corporation, Armonk, N.Y.

[21] Appl. No.: 417,176

[22] Filed: Apr. 5, 1995

[51] Int. Cl.⁶ .................................................. G11C 11/00
[52] U.S. Cl. .............................................................. 365/151
[58] Field of Search ............................................. 365/151

[56] References Cited

U.S. PATENT DOCUMENTS

| | | | |
|---|---|---|---|
| 3,735,186 | 5/1973 | Klopfer et al. | 313/346 R |
| 4,059,783 | 11/1977 | Nakaizumi et al. | 315/107 |
| 4,274,012 | 6/1981 | Simko | 307/238.3 |
| 4,399,523 | 8/1983 | Gerber et al. | 365/218 |
| 4,437,172 | 3/1984 | Masuoka | 365/182 |
| 4,486,769 | 12/1984 | Simko | 357/41 |
| 4,592,894 | 6/1986 | Panitz | 422/69 |
| 4,826,732 | 5/1989 | Kazan et al. | 428/432 |
| 4,831,614 | 5/1989 | Duerig et al. | 369/101 |
| 4,910,565 | 3/1990 | Masuoka | 357/23.5 |
| 5,043,577 | 8/1991 | Pohl et al. | 250/306 |
| 5,144,148 | 9/1992 | Eigler | 250/492.3 |
| 5,151,594 | 9/1992 | McClelland | 250/306 |
| 5,153,691 | 10/1992 | Guterman | 357/23.14 |
| 5,166,919 | 11/1992 | Eigler | 369/126 |
| 5,216,631 | 6/1993 | Sliwa, Jr. | 365/174 |
| 5,231,606 | 7/1993 | Gray | 365/225.6 |
| 5,240,166 | 8/1993 | Fontana, Jr. et al. | 228/111.5 |
| 5,307,311 | 4/1994 | Sliwa, Jr. | 365/174 |
| 5,312,777 | 5/1994 | Cronin et al. | 437/195 |
| 5,323,376 | 6/1994 | Eigler | 369/126 |

*Primary Examiner*—David C. Nelms
*Assistant Examiner*—Trong Phan
*Attorney, Agent, or Firm*—Robert B. Martin

[57] ABSTRACT

The invention relates to a storage device for storage of information using field emission comprising two spaced apart members. Each member comprises a plurality of parallel conducting lines having adsorbates disposed thereon. The lines are disposed on a nonconductive substrate. The members are positioned with the parallel conducting lines of each member facing each other without planar alignment of the lines of one member with the lines of the other member.

9 Claims, 2 Drawing Sheets

DEVICE FOR INFORMATION STORAGE USING FIELD EMISSION

FIELD OF THE INVENTION

The present invention relates to a device for storing information using field emission effect and also relates to a process for storing information using the field emission effect.

BACKGROUND OF THE INVENTION

There is a continuing desire in the computer industry to increase the storage density of computer memory and build smaller electronic components for computers. Kazan et al., U.S. Pat. No. 4,826,732 issued May 2, 1989, discloses using a scanning tunneling microscope ("STM") to selectively remove or deposit a plurality of adsorbate atomic particles from a surface in an orderly fashion to record information. The STM can then be scanned over the same area again to read out the recorded information with the changes in the tunneling current.

Eigler U.S. Pat. No. 4,987,312, issued Jan. 22, 1991, discloses moving an atom or molecule from one position on a substrate to another position on the substrate with an STM to record information and also repositioning atoms or molecules to fabricate a multi-atom structure. Copending application Ser. No. 07/569,270, now U.S. Pat. No. 5,144,148, filed Aug. 17, 1990 is a CIP of and extends the teachings of this Eigler patent.

Sliwa U.S. Pat. No. 5,307,311 discloses a memory device which utilizes the tunneling current to detect topographical changes on a surface such as absorption/adsorption of mobile ionic species (e.g. sodium).

Sliwa discloses a plurality of storage elements in each device with either the bit-array or read/write head (tip) disposed on a moving cantilever. Sliwa also discloses mechanisms for maintaining the requisite few angstrom tip-bit operational gap. However, the maintenance of the proper tunneling gap is difficult under normal operating conditions of a storage device.

Therefore, there still is a continuing need in the art for increasing storage density of storage devices without having to maintain a tunneling gap. The present invention provides a device for increasing the storage density of storage devices. Other advantages will be apparent from the following disclosure.

SUMMARY OF THE INVENTION

The present invention relates to a storage device for storage of information using field emission comprising two spaced apart members. Each member comprises a plurality of parallel conducting lines having adsorbates disposed thereon. The lines are disposed on a nonconductive substrate. The members are positioned with the parallel conducting lines of each member facing each other without planar alignment of the lines of one member with the lines of the other member. The present invention also relates to the process for storing information using the device of the present invention.

A more thorough disclosure of the present invention is presented in the detailed description which follows and the accompanying figures.

DETAILED DESCRIPTION OF THE INVENTION

Figure 1:
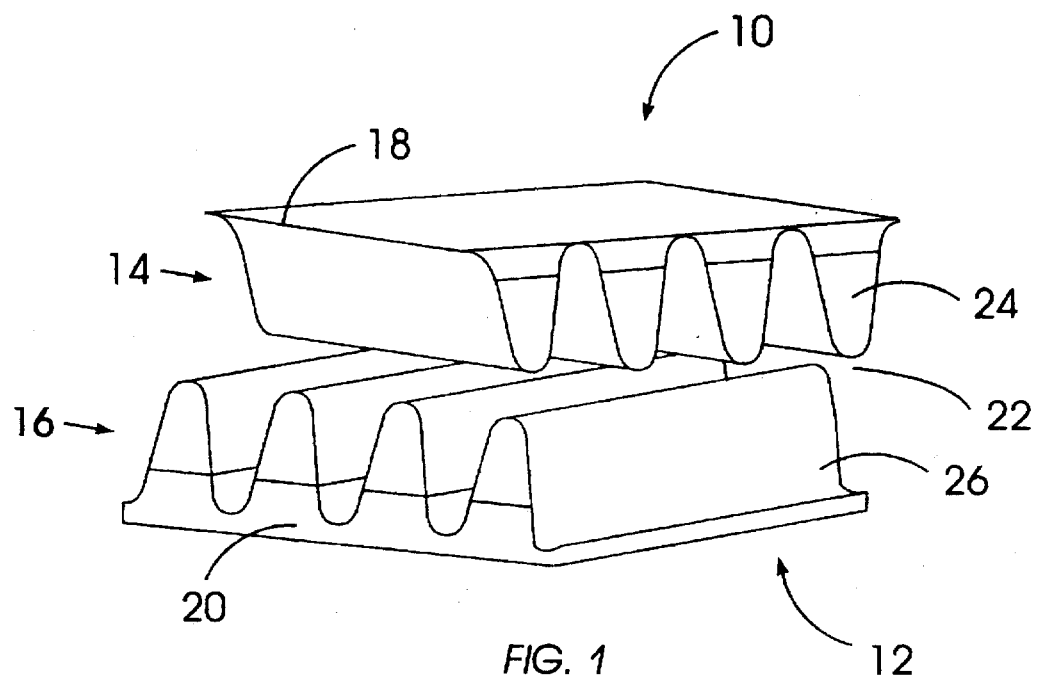
FIG. 1 is a diagram of an embodiment of the storage device of the present invention.

The present invention relates to an improved storage device and process for its use. Referring to FIG. 1, there is shown an embodiment of the storage device comprising two spaced-apart members 10 and 12. Each member has a plurality of parallel conducting lines 14 and 16 disposed on nonconductive substrates 18 and 20. The members 10 and 12 are positioned so that the conducting lines 14 and 16 are facing each other without planar alignment of the lines of one member with the lines of the other member. Preferably, the members are positioned so that the lines of one member are about perpendicular (90°±10°) with respect to the lines of the other member. The members are suitably spaced apart by small distances (e.g. about 20Å to about 3 micron). The members can suitably be spaced apart by spacers which can be lithographically formed on the surface of the substrate. The conducting lines can be formed by laser-focused deposition using a standing wave laser field as disclosed by McClelland et al. Science vol. 262, 877 (Nov. 5, 1993).

The storage device can be conveniently operated in a vacuum or in a gas (e.g. air). Alternatively, the space between the members can be filled with a dielectric material such as silicon dioxide or alumina. In operation, adsorbates are disposed on one or both conducting lines. Adsorbate means one or more atoms or one or more molecules (non bonded or bonded together) which are positioned on the surface of the conducting line(s). The adsorbates may be sparsely distributed or alternatively disposed as a thin film on the conducting lines(s). Suitable adsorbates include atoms which become charged upon adsorption such a alkali or alkaline earth atoms on transition metals. Other suitable adsorbates include dipolar molecules such as benzonitrile and acetonitrile which reorient in an electric field or a ferroelectric film which changes polarization. The storage device is provided with suitable electrical equipment such as devices to apply potentials to selected lines and detectors to measure electrical current between selected lines.

Bit points are located at the overlap region of the line of one member and the line of the other member. Overlap region 22 is the bit point for lines 24 and 26.

To write at a bit point 22 dc voltage pulses of opposite polarity are simultaneously applied along lines 24 and 26. The voltage pulse on each line is below the voltage required to write at a bit point. However the voltage pulse at bit point 22 from both lines 24 and 26 causes reversible change of the state of the adsorbate(s) from a first state to a second state. In the first state, the field emission at bit point 22 is enhanced (high field emission). In the second state the field emission is not enhanced (low field emission). The bit point can be switched back to the first state by reversing the polarity of the pulse. Alternatively, the bit point can be switched back and forth between the two states by pulses which differ in amplitude, duration, shape or, in the case of alternating current pulses, frequency. The bit point 22 is read by application of voltage lower than the write voltage and measuring the field emission (conductance) between lines 24 and 26. The difference in the field emission (between high field emission and low field emission) can be used to record bit information.

For example, when a surface having a positively charged adsorbate (like an alkali atom on a transition metal surface) is pulsed positive, atomic positions of high field, such as those near protrusions or step edges, become energetically favored, so the atom moves to such a position. When the surface is pulsed negative, the atom will move to a position having low field, such as a locally flat terrace. Information is recorded permanently because potential barriers on the surface keep the atom in position when the voltages are removed. Because field emission tends to occur near high field sites, the field emission is enhanced when positive adsorbates, which lower the work function, are located at these sites. The bit can be read non-destructively when field emission is induced by a negative voltage small enough not to move the adsorbate. In alternative embodiments, the adsorbate can be reversibly changed from a first state to a second state by reorientation of dipolar adsorbates or change in polarization of a ferroelectric adsorbate film.

To enable field emission to occur at a lower voltage, tips can be formed at the bit points. Tips can be grown at the bit points after assembly of the storage device by applying a large potential between conducting lines (e.g. lines 14 and 16) in the presence of chemical vapor to electrodeposit material at the bit points. The tips would be self-aligned during the growth process.

The following examples are detailed descriptions of the present invention. The detailed descriptions fall within the scope of, and serve to exemplify, the more generally-described invention set forth above. The examples are presented for illustrative purposes only, and are not intended as a restriction on the scope of the invention.

EXAMPLE 1

Figure 2:
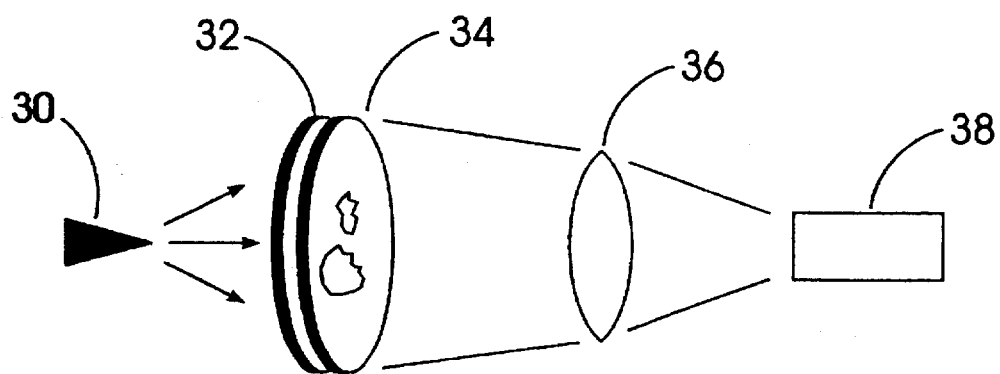
FIG. 2 is an apparatus to store information using field emission.

Referring to FIG. 2 there is shown an apparatus for storing information using field emission. The apparatus generally comprises field emission tip 30, microchannel image intensifier plate 32, phosphor screen 34, lens 36 and detector 38. The screen of the apparatus, which displays a region of the tip about 70 nm across, also functions as a counter electrode and was placed 12 cm from the tip. The apparatus was placed into an evacuated chamber.

Figure 3A:
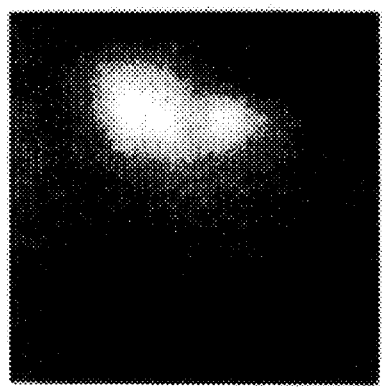
FIG. 3a is an image of enhanced field emission from a tip having adsorbates thereon.
Figure 3B:
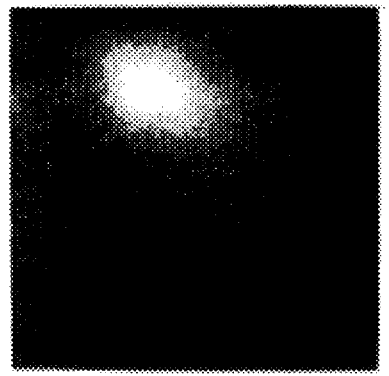
FIG. 3b is an image from the same tip without enhanced field emission.

Sodium atoms were introduced into the evacuated chamber to deposit a low density monolayer on a <111> tungsten tip held at 80 Kelvin. Referring to FIG. 3, the tip was repeatedly pulsed negative (about−2200 V, 10 nsec) until a bright small spot appeared on the screen while reading the tip by application of a voltage of−650 V, (the small spot on FIG. 3a adjacent to a large spot). The diameter of the small spot is equivalent to a diameter of 5 am on the tip surface, which is about the expected resolution limit. This small spot probably represents a single atom on a [211] plane. The large spot to the left of the small spot was present before the deposition of sodium, and was probably due to emission along the <111> direction at the corner of three [211] planes. The tip was then pulsed positive (1000 volts, 1 sec) and read by application of−650 V. The spot had disappeared due to the lowering of the field emission from the tip. (FIG. 3b).

This cycle operation was successfully repeated twelve consecutive times.

EXAMPLE 2

Using the apparatus of Example 1, the tungsten tip was exposed to oxygen and then heated to 1100° K. to remove the physisorbed oxygen. After cooling to 80° K., sodium atoms were introduced onto the tip and the tip exposed to 200 cycles (400 writes) in accordance with the procedure of Example 1. The correct transition occurred for 88% of the write pulses.

Although this invention has been described with respect to specific embodiments, the details thereof are not to be construed as limitations, for it will be apparent that various embodiments, changes, and modifications may be resorted to without departing from the spirit and scope thereof, and it is understood that such equivalent embodiments are intended to be included within the scope of this invention.

We claim:

1. A storage device comprising two spaced apart members, each member comprising a plurality of parallel conducting lines, having adsorbates absorbed thereon, and the lines disposed on a nonconductive substrate, the members positioned with the parallel conducting lines of each member facing each other without planar alignment of the lines of one member with the lines of the other member.

2. The device of claim 1 wherein the conducting lines of one member are about perpendicular to the conducting lines of the other member.

3. The device of claim 2 wherein the space between the members is filled with air or dielectric material.

4. The device of claim 3 wherein the adsorbate is selected from alkali atoms, alkaline earth atoms or dipolar molecules.

5. A process for storing information comprising:

(i) disposing adsorbates on the parallel conducting lines disposed on two spaced apart members, the members positioned with the parallel conducting lines of each member facing each other without planar alignment of the lines of one member with the lines of the other member;

(ii) electrically pulsing the members to change the surface of the a line back and forth from a first state to a second state;

(iii) measuring the field emission in the first state and in the second state.

6. The process of claim 5 wherein the conducting lines of one member are about perpendicular to the conducting lines of the other member.

7. The process of claim 6 wherein the space between the members is filled with air or dielectric material.

8. The process of claim 7 wherein the adsorbate is selected from alkali atoms, alkaline earth atoms or dipolar molecules.

9. The process of claim 8 wherein the change of the state occurs by movement of the adsorbates.

* * * * *